(12) United States Patent
Benzinger et al.

(10) Patent No.: US 6,750,509 B2
(45) Date of Patent: Jun. 15, 2004

(54) DRAM CELL CONFIGURATION AND METHOD FOR FABRICATING THE DRAM CELL CONFIGURATION

(75) Inventors: Herbert Benzinger, München (DE); Frank Richter, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/156,540

(22) Filed: May 28, 2002

(65) Prior Publication Data

US 2002/0163842 A1 Nov. 7, 2002

Related U.S. Application Data

(63) Continuation of application No. PCT/DE00/03987, filed on Nov. 14, 2000.

(30) Foreign Application Priority Data

Nov. 26, 1999 (DE) .......................................... 199 57 123

(51) Int. Cl.⁷ ............................................... H01L 29/72
(52) U.S. Cl. ...................... 257/330; 257/296; 257/301; 257/304
(58) Field of Search ................................ 257/296, 301, 257/304, 330, 377; 438/248, 249

(56) References Cited

U.S. PATENT DOCUMENTS

| | | | |
|---|---|---|---|
| 5,309,008 A | * | 5/1994 | Watanabe .................... 257/304 |
| 5,543,348 A | * | 8/1996 | Hammerl et al. ............ 438/249 |
| 5,555,520 A | | 9/1996 | Sudo et al. |
| 5,827,765 A | | 10/1998 | Stengl et al. |
| 5,926,707 A | | 7/1999 | Seo |
| 5,936,271 A | * | 8/1999 | Alsmeier et al. ............ 257/301 |
| 5,945,707 A | * | 8/1999 | Bronner et al. ............. 257/330 |
| 6,204,527 B1 | | 3/2001 | Sudo et al. |
| 6,440,794 B1 | * | 8/2002 | Kim .......................... 438/248 |

FOREIGN PATENT DOCUMENTS

| | | |
|---|---|---|
| EP | 0 644 591 A1 | 3/1995 |
| EP | 0 920 059 A2 | 6/1999 |
| EP | 0 949 684 A2 | 10/1999 |
| JP | 11 121 710 | 4/1999 |
| JP | 11 168 186 | 6/1999 |

OTHER PUBLICATIONS

Internal Publication: "Substrate Plate Trench DRAM Cell with an Increased Background Doping (Halo), Surrounding the Strap Region", IBM Technical Disclosure Bulletin, vol. 37, No. 10, Oct. 1994, pp. 341–342.

* cited by examiner

*Primary Examiner*—David Nelms
*Assistant Examiner*—Dao H. Nguyen
(74) *Attorney, Agent, or Firm*—Laurence A. Greenberg; Werner H. Stemer; Gregory L. Mayback

(57) ABSTRACT

A DRAM cell configuration is described in which a memory cell in each case has a storage capacitor and a read-out transistor. For connecting to the read-out transistor, a buried strap contact is produced by outdiffusion of dopants from the electrode of the storage capacitor. The buried strap contact is superposed by the implantations of the source/drain region of the read-out transistor, so that the implantations of the source/drain region form the boundary of the space charge zone of a p/n junction of the memory cell.

13 Claims, 1 Drawing Sheet

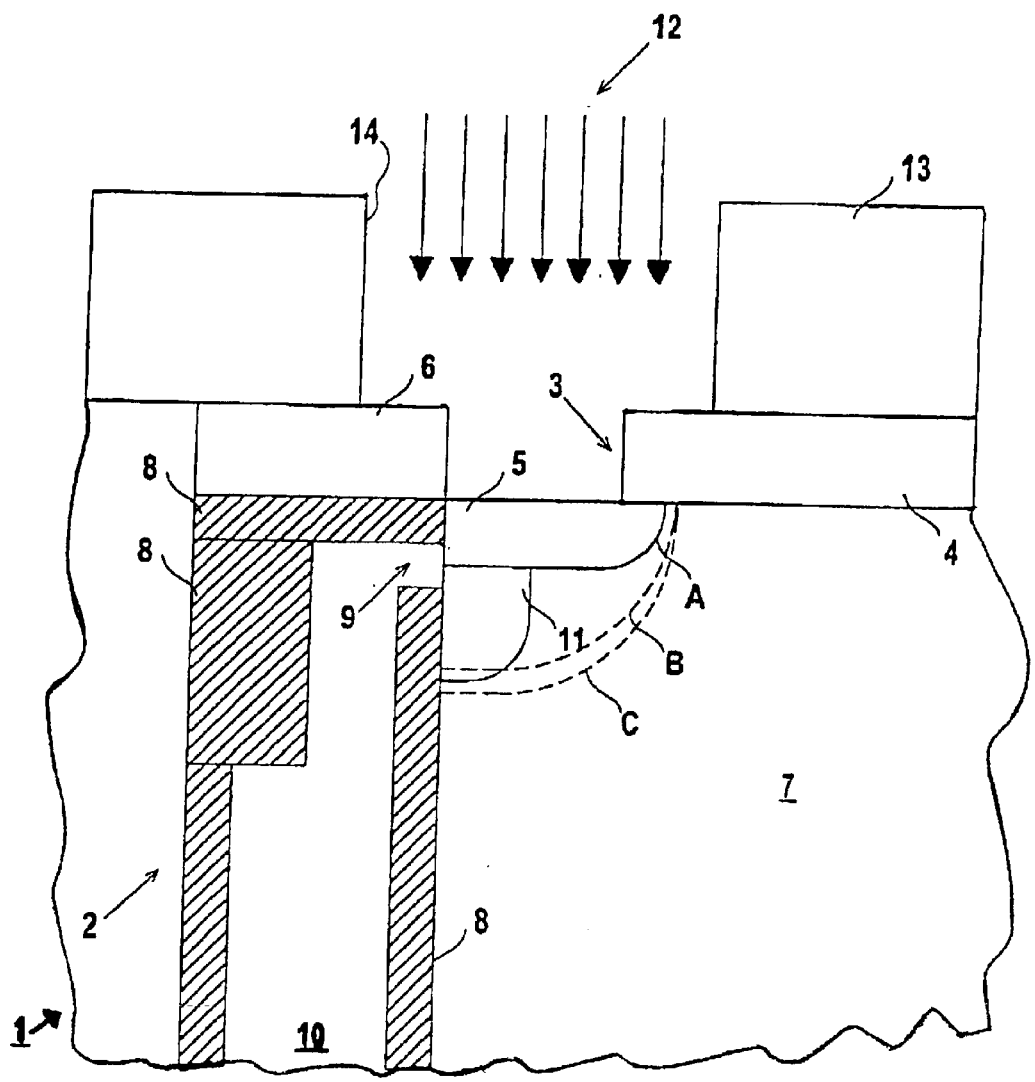

DRAM CELL CONFIGURATION AND METHOD FOR FABRICATING THE DRAM CELL CONFIGURATION

CROSS-REFERENCE TO RELATED APPLICATION

This application is a continuation of copending International Application No. PCT/DE00/03987, filed Nov. 14, 2000, which designated the United States and was not published in English.

BACKGROUND OF THE INVENTION

Field of the Invention

The invention relates to a DRAM cell configuration and a method for fabricating it.

In known dynamic random access memory (DRAM) cell configurations, memory cells having one transistor, so-called one-transistor memory cells, are usually used. Such a one-transistor memory cell contains a storage capacitor in addition to the transistor, which forms a read-out transistor. An information item is stored in the storage capacitor in the form of an electric charge that represents a logic value, 0 or 1. By driving the read-out transistor via a word line, the information item can be read out via a bit line.

Since the storage density increases from memory generation to memory generation, the required area of the memory cell must be reduced from generation to generation. Since limits are imposed on the reduction of the size of the memory cell due to the minimum feature size that can be fabricated in the respective technology, this is also associated with an alteration of the construction of the memory cells. Thus, up to the 1 Mbit generation of DRAM cell configurations, both the read-out transistor and the storage capacitor were realized as planar components. Starting from the 4 Mbit memory generation, a three-dimensional configuration of the storage capacitor and the read-out transistor had to be effected.

In this case, the storage capacitors are realized, in particular, not in planar fashion but rather in trenches. Such memory cells are known as deep trench memory cells.

Such a storage capacitor contains two electrodes that are isolated by a dielectric and are disposed lying one above the other in a trench in a manner jointly surrounded by an insulator layer. The trenches are incorporated into a semiconductor substrate and open out at the topside thereof. The top electrode is preferably composed of doped polysilicon. The insulator layer of a trench has, at the topside thereof, an opening through which dopants are outdiffused in the polysilicon. The zone of the outdiffusion behind the opening of the insulator layer forms a buried strap contact for connecting the storage capacitor to the read-out transistor. The read-out transistor has a gate electrode and a source/drain region. The gate electrode is applied at a predetermined distance from the storage capacitor at the topside of the semiconductor substrate. Implantation of dopants produces the source/drain region, which lies above the buried strap contact at the topside of the semiconductor substrate and adjoins the buried strap contact. The boundary regions of the buried strap contact and of the adjoining source/drain region, which boundary regions adjoin the interior of the semiconductor substrate, form a p/n junction of the memory cell.

U.S. Pat. No. 5,555,520 describes a trench capacitor for DRAM cells which has a monocrystalline electrode and which is connected to the gate electrode of the transistor via a buried strap.

The reference titled "Substrate Plate Trench DRAM Cell with an Increased Background Doping (Halo) Surrounding the Strap Region", IBM Technical Disclosure Bulletin, Vol. 37 No. 10 October 1994, pages 341–342, describes a method which produces a highly concentrated region (halo) surrounding a buried strap contact, the "halo" having the opposite conductivity to the buried strap and the connected source/drain region.

An essential problem in DRAM cell configurations is that the information stored in a memory cell is lost through leakage currents in the memory cell. The time within which the information in a memory cell is lost is called the retention time. Therefore, the information items stored in the memory cells of a DRAM cell configuration must be refreshed at regular time intervals. The time intervals within which the refreshes are affected are called refresh times.

As storage capacities of DRAM cell configurations increase, it becomes more and more difficult to achieve the required retention times. Therefore, optimization of the leakage current paths present is gaining more and more importance.

In this case, the essential leakage current path is formed by the p/n junction at the boundary regions of the buried strap contact and of the source/drain region. Such leakage currents are caused, in particular, by generation centers such as, for example, point defects that arise during the outdiffusion of dopants from the polysilicon layer forming the electrode of the storage capacitor. Moreover, two-dimensional crystal defects such as dislocations, for example, may adhere at the interface between the buried strap contact and the semiconductor substrate, which is preferably formed by a silicon single crystal, or arise there as a result of epitaxial recrystallization of polysilicon. If such defects lie in or at a short distance from the space charge zone of the p/n junction, then this can lead to a considerable increase in the leakage current of the p/n junction.

SUMMARY OF THE INVENTION

It is accordingly an object of the invention to provide a DRAM cell configuration and a method for fabricating the DRAM cell which overcome the above-mentioned disadvantages of the prior art devices and methods of this general type, in which the retention times in DRAM cell configuration is increased.

With the foregoing and other objects in view there is provided, in accordance with the invention, a dynamic random access memory (DRAM) cell configuration. The DRAM cell configuration contains a semiconductor substrate having trenches formed therein, an insulating layer having an opening formed therein, and storage capacitors disposed in the trenches of the semiconductor substrate. Each of the storage capacitors has an electrode being isolated from the semiconductor substrate by the insulating layer. Read-out transistors are provided. Each of the read-out transistors is assigned to an associated one of the storage capacitors. Each of the read-out transistors has a gate electrode and a source/drain region produced by implantation of dopants and is disposed in the semiconductor substrate. The source/drain region is connected to the electrode of an associated one of the storage capacitors through the opening in the insulating layer. Buried strap contacts are provided and each of the buried strap contacts is associated with a respective storage capacitor and connected to the source/drain region of a respective read-out transistor by an outdiffusion of further dopants from the electrode of the respective storage capacitor. The doping type of the outdiffusion and of the implantation are identical. The implantation of the source/drain region in each case extends at least as deeply into the semiconductor substrate as the outdiffusion of the buried strap contacts so that the implantation of the source/drain region forms a boundary of a space charge zone of a p/n junction.

In the cell configuration according to the invention, in the individual memory cells, the buried strap contacts are in each case superposed by the implantation of the source/drain regions, so that the implantation of the source/drain regions in each case forms the boundary of the space charge zone of the p/n junction. In this case, preferably the entire or virtually the entire area of a buried strap contact is superposed by the implantation of the source/drain region.

In order to fabricate the configuration, after the application of the gate electrodes to the semiconductor substrate, dopants are implanted selectively into the interspaces between the storage capacitors and the gate electrodes for the purpose of producing the source/drain regions. Suitable masks are used for this, the gate electrodes preferably also being at least partly masked by the masks.

By the selective implantation carried out in this way, the source/drain regions of the read-out transistors can be shifted into greater depths of the semiconductor substrate, so that the buried strap contacts are at least partly superposed by the implantation of the source/drain regions. Consequently, the boundaries of the space charge zones of the p/n junctions are no longer determined by the zones of the outdiffusion of the buried strap contacts, but rather by the regions of the implantations of the source/drain regions. What is thereby achieved is that the generation centers and defects in a buried strap contact are more than one diffusion length for minority charge carriers removed from the space charge zone of a p/n junction.

Consequently, such minority charge carriers recombine before they can reach the p/n junction and are therefore electrically inactive. This results in a considerable reduction of the leakage currents via the p/n junction and thus an increase in the retention time.

A further aspect of the method according to the invention is that the implantation of the source/drain regions is effected in large depths of the semiconductor substrate in such a way that the function of the remaining components of a memory cell, in particular the function of the read-out transistor, is not impaired.

In particular, lateral scattering of the implantation in the semiconductor substrate is largely avoided by virtue of the selective implantation of the dopants in the interspace between gate electrode and storage capacitor. Such lateral scattering would in particular, impair the blocking properties of the read-out transistor.

In accordance with an added feature of the invention, the semiconductor substrate is formed by a silicon single crystal.

In accordance with another feature of the invention, the implantation of the source/drain region is formed by phosphorous or arsenic.

In accordance with an additional feature of the invention, the electrode is formed by doped polysilicon, in particular, the doped polysilicon is arsenic-doped.

In accordance with a further feature of the invention, the insulator layer is one of a plurality of insulator layers, and the storage capacitors disposed in the trenches are electrically insulated from the surroundings by the insulator layers.

In accordance with another added feature of the invention, the insulator layers are composed of oxides fabricated by a tetraethyl orthosilicate (TEOS) method.

In accordance with another additional feature of the invention, the opening is one of a plurality of openings formed in a region of a surface of each of the trenches for each of the storage capacitors. The openings each have a diameter of about 50 nm.

In accordance with another further feature of the invention, each of the buried strap contacts is located behind one of the openings and has a width and a depth of about 100 nm in each case. An entire area of a respective buried strap contact is substantially superposed by the implantation of the source/drain region. A penetration depth of the implantation of the source/drain region is 150–200 nm.

In accordance with an added feature of the invention, the source/drain region has a width substantially corresponding to twice to three times a value of a width of the respective buried strap contact.

With the foregoing and other objects in view there is provided, in accordance with the invention, a method for fabricating a dynamic random access memory (DRAM) cell configuration. The method includes the steps of providing a semiconductor substrate, fabricating trenches in the semiconductor substrate, fabricating insulator layers with openings and electrodes of storage capacitors in the trenches, outdiffusing of dopants from the electrodes through the openings for producing buried strap contacts for connection to read-out transistors associated with the storage capacitors, and forming gate electrodes of the read-out transistors on the semiconductor substrate. Source/drain regions of the read-out transistors are produced by selective implantation of further dopants into interspaces between the storage capacitors and the gate electrodes at least as deeply into the semiconductor substrate as outdiffusions formed by the buried strap contacts. The doping type of the outdiffusions of the buried strap contacts and of the implantations are identical.

In a first configuration of the method according to the invention, the implantation of the source/drain regions is effected in a single-stage process, the implantation being effected with energies up to 60 keV.

In a second configuration of the method according to the invention, the implantation of the source/drain regions is effected in a two-stage process.

The first stage of the implantation is affected after the application of the gate electrodes at relatively low energies in a region of about 15 keV. The second stage of the implantation is affected after nitride spacers have been applied to the gate electrodes. The nitride spacers mask the gate electrodes also at the lateral side walls, so that during the subsequent implantation, lateral scattering of implanted dopants below the gate electrode is made more difficult. As a result, the second stage of the implantation can be effected at higher energies, without having to fear impairment of the blocking properties of the read-out transistors through lateral scattering of the dopants. The second stage of the implantation is typically carried out with energies in the range of 20–25 keV.

Other features which are considered as characteristic for the invention are set forth in the appended claims.

Although the invention is illustrated and described herein as embodied in a DRAM cell configuration and a method for fabricating the DRAM cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic illustration of a detail from a memory cell of a DRAM cell configuration according to the invention.

DESCRIPTION OF THE PREFERRED EMBODIMENTS

Referring now to the single FIGURE of the drawing, there is shown a detail of a memory cell 1 of a DRAM cell configuration. The DRAM cell configuration contains a multiplicity of the memory cells 1 illustrated in FIG. 1, which are preferably disposed in matrix form. The DRAM cell configuration according to the invention contains memory cells 1 that are configured as single-transistor memory cells. Each memory cell 1 in each case has a storage capacitor 2 and a read-out transistor 3. The read-out transistor 3 has a gate electrode 4 and a source/drain region 5.

An information item is stored in the storage capacitor 2 in the form of an electric charge that represents a logic value, 0 or 1. By driving the read-out transistor 3, the information item can be read out via a bit line. As illustrated in FIG. 1, a word line 6 of an adjacent memory cell runs above the storage capacitor 2. The non-illustrated bit line is located on the right beside the gate electrode 4 of the read-out transistor 3 and is connected to a drain terminal.

The storage capacitors 2 are realized in trenches. Such trenches are incorporated by known etching techniques into a semiconductor substrate 7, which is preferably formed by a silicon single crystal.

The trench of the memory cell 1 has insulator layers 8 at its side walls and at its top side, which opens out at a surface of the semiconductor substrate 7, the storage capacitor 2 disposed in the trench being electrically insulated from the surroundings by the insulator layers 8. The insulator layers 8 are preferably fabricated in a TEOS method and are composed of oxides, preferably of $SiO_2$.

The FIGURE illustrates an upper part of the trench that is closed off at its topside by the first insulator layer 8 having a thickness of about 50 nm. The side walls of the trench are bounded by the insulator layers 8 having approximately the same thickness. The insulator layer 8 is widened somewhat on one side of the trench. The widened section of the insulator layer 8 forms the so-called shallow trench isolation. At the opposite side of the trench, the lateral insulator layer 8, which forms the so-called collar, ends shortly before the insulator layer 8 at the topside of the trench, so that an opening 9 then remains between the two insulator layers 8. The opening has a diameter of about 50 nm.

Consequently, the trench is tapered toward its upper end by the shallow trench isolation, the opening 9 being located in this region.

The storage capacitor 2 has a first electrode lying in the upper region of the trench. An underside of the electrode is adjoined by a non-illustrated dielectric. The underside thereof is in turn adjoined by a non-illustrated counter electrode of the storage capacitor 2.

In the present exemplary embodiment, the first electrode of the storage capacitor 2 contains a layer of doped polysilicon 10, arsenic being used as the dopant in the present case. The counter electrode may be composed of the same material.

The dielectric is preferably formed by an ONO layer, the ONO containing a triple layer made of $SiO_2$, $Si_3N_4$ and $SiO_2$.

By outdiffusion of the dopants from the polysilicon 10 forming the first electrode, a buried strap contact 11 for connecting the storage capacitor 2 to the read-out transistor 3 is generated behind the opening 9 in the insulator layer 8. The buried strap contact 11 directly adjoins the opening 9 and the collar 8 bounding the opening 9. A width of the buried strap contact 11 is about 100 nm. From the opening 9, the buried strap contact 11 extends approximately 100 nm into a depth of the semiconductor substrate 7. The buried strap contact 11 has the smallest possible sheet resistance for connection to the read-out transistor 3.

The source/drain region 5 is generated by implantation 12 of dopants into the semiconductor substrate 7. The implantation zone extends from the storage capacitor 2 as far as the gate electrode 4 of the read-out transistor 3. For the case where the read-out transistor 3 is an n-channel transistor, dopants such as, for example, arsenic or phosphorus are used for an implantation 12.

In known implantation methods, the entire memory cell 1 is implanted with dopants, in particular including the gate electrode 4 and also the bit line contact. In order to prevent the read-out transistor 3 from being impaired by the implantation 12, energies of about 14 keV to 20 keV are typically used for the implantation 12. The source/drain region 5 that is illustrated in the FIGURE and is bounded by a line A typically results for this case. In this case, the boundary regions of the buried strap contact 11 and of the source/drain region 5 form the boundary of the space charge zone of a p/n junction in the memory cell 1.

The polysilicon 10 of the electrode of the storage capacitor 2 is electrically insulated toward the sides by the insulator layers 8 and toward its underside by the dielectric. Consequently, the p/n junction of the memory cell 1 remains as the dominant leakage current path of the memory cell 1.

The essential leakage current mechanisms that lead to the discharge of the memory cell 1 are, generation centers such as, for example, point defects which are formed during the outdiffusion of the dopant from the polysilicon 10 of the first electrode. Depending on the temperature control during the fabrication process and mechanical stresses in the various regions, such generation centers can pass into the space charge zone of the p/n junction and thus lead to leakage currents. Equally, two-dimensional crystal defects such as dislocations, for example, may adhere at the interface of the buried strap contact 11 or arise there and thus likewise lead to leakage currents.

In order to suppress such leakage currents, the dopants for generating the source/drain region 5 are implanted into greater depths of the semiconductor substrate 7. In the FIGURE, two boundary lines of such source/drain regions 5 are depicted by dashes and identified by the reference numerals B and C. The penetration depth of the implantation 12 into the semiconductor substrate 7 is about 150–200 nm. In this case, the source/drain region 5 and, in particular, also the boundary lines B and C thereof extend over the entire interspace between the storage capacitor 2 and the gate electrode 4, so that the width of the source/drain region 5 approximately corresponds to twice to three times the value of the width of the buried strap contact 11.

The source/drain region 5 bounded by the boundary line B overlies the majority of the area of the buried strap contact 11 with the exception of the lower edge thereof. The source/drain region 5 bounded by the boundary line C even overlies the entire buried strap contact 11. In both cases, the p/n junction of the memory cell 1 is determined by the implantation 12 of the source/drain region 5, so that the space charge zone of the p/n junction runs completely or virtually completely along the boundary lines B and C, respectively, of the source/drain region 5. As a result, the generation centers are more than one diffusion length for minority charge carriers removed from the space charge zone of the p/n junction. Consequently, the minority charge carriers recombine before they reach the p/n junction. The crystal defects at the boundary of the buried strap contact 11 also lie at a sufficiently large distance from the space charge zone of the p/n junction, so that neither the generation centers nor the crystal defects lead to appreciable leakage currents. As a result, long retention times are obtained for the DRAM cell configuration according to the invention.

The enlargement of the source/drain region 5 is obtained, in particular, by carrying out the implantation 12 of the dopants with higher energies. In principle, in this case the implantation 12 can be carried out in such a way that implantation is effected virtually into the entire memory cell 1, in particular including into the bit line contact and the gate electrode 4. However, this holds the risk of impairing the functionality of these parts of the memory cell. Moreover, lateral scattering of the dopants in the semiconductor substrate 7 is then also obtained, which leads to impairment of the blocking action of the read-out transistor 3. These impairments would have to be compensated for by additional method steps, such as, for example, a channel implantation or a well implantation.

In order to avoid such measures, the implantation 12 is effected selectively into the interspace between the gate electrode 4 and the storage capacitor 2. For this purpose, a resist mask 13 is preferably applied to the DRAM cell configuration to be created, openings 14 of the resist mask 13 are configured in such a way that only the interspaces between the storage capacitors 2 and the gate electrodes 4 are freed. The gate electrode 4 is covered completely or virtually completely. The implantation 12 for fabrication of the source/drain region 5 is then effected through the openings 14.

It is advantageous in this case that the implantation 12 can be carried out with high energies, without impairments of the read-out transistor 3 occurring as a result of this.

In a first embodiment of the invention, the implantation 12 is effected in a single-stage process, energies up to about 60 keV being used for the implantation 12 in this case.

In a second embodiment of the invention, the implantation 12 is effected in two stages. The first stage of the implantation 12 is carried out with energies in the region of 15 keV. Afterward, nitride spacers are applied to the gate electrodes 4, after which, in a second stage, a further implantation 12 is effected with energies in the range from 20 keV to 25 keV.

The nitride spacer encapsulates the respective gate electrode 4 not only at the topside but also at the side areas. A mask applied on the nitride spacer or the nitride spacer itself thus masks a larger area than the gate electrode 4 or a mask 10 situated thereon alone. The second implantation 12 is therefore effected on a smaller area than the first implantation 12. In this way, during the implantation 12, lateral scattering within the semiconductor substrate 7 is minimized further.

We claim:

1. A dynamic random access memory (DRAM) cell configuration, comprising:

a semiconductor substrate having trenches formed therein, each of said trenches having a sidewall;

an insulating layer disposed in each of said trenches and having an opening formed therein in each of said sidewalls of said trenches;

storage capacitors disposed in said trenches of said semiconductor substrate, each of said storage capacitors having an electrode being isolated from said semiconductor substrate by said insulating layer;

read-out transistors, each of said read-out transistors assigned to an associated one of said storage capacitors and an associated one of said openings, each of said read-out transistors having a gate electrode and a source/drain region produced by implantation of dopants and disposed in said semiconductor substrate, said source/drain region connected to said electrode of an associated one of said storage capacitors through said associated one of said openings in said insulating layer extending within said semiconductor substrate from said associated one of said openings to said gate electrode; and buried strap contacts, each of said buried strap contacts associated with a respective storage capacitor and connected to said source/drain region of a respective read-out transistor by outdiffusion of further dopants from said electrode of said respective storage capacitor and extending from said opening of said trench of said respective storage capacitor, said outdiffusion and said implantation having identical doping, said implantantion of said source/drain region in each case extending deeper into said semiconductor substrate along a direction parallel to said sidewall of said trench of said respective storage capacitor than said outdiffusion of said buried strap contacts extends into said semiconductor substrate and extending wider into said semiconductor substrate along a direction from said opening in said sidewall of said trench of said respective storage capacitor to said gate electrode of said respective read-out transistor so that said implantation of said source/drain region forms a boundary of a space charge zone of a p/n junction.

2. The DRAM cell configuration according to claim 1, wherein said semiconductor substrate is formed by a silicon single crystal.

3. The DRAM cell configuration according to claim 1, wherein said implantation of said source/drain region is formed by one of phosphorous and arsenic.

4. The DRAM cell configuration according to claim 1, wherein said electrode is formed by doped polysilicon.

5. The DRAM cell configuration according to claim 4, wherein said doped polysilicon is arsenic-doped.

6. The DRAM cell configuration according to claim 1, wherein:

said insulator layer is one of a plurality of insulator layers; and said storage capacitors disposed in said trenches are electrically insulated from surroundings by said insulator layers.

7. The DRAM cell configuration according to claim 6, wherein said insulator layers are composed of oxides fabricated by a tetraethyl orthosilicate (TEOS) method.

8. The DRAM cell configuration according to claim 6, wherein said opening is one of a plurality of openings formed in a region of a surface of each of said trenches for each of said storage capacitors.

9. The DRAM cell configuration according to claim 8, wherein said openings have a diameter of about 50 nm.

10. The DRAM cell configuration according to claim 8, wherein each of said buried strap contacts is located behind one of said openings and has a width and a depth of about 100 nm in each case.

11. The DRAM cell configuration according to claim 10, wherein substantially an entire area of a respective buried strap contact is superposed by said implantation of said source/drain region.

12. The DRAM cell configuration according to claim 11, wherein a penetration depth of said implantation of said source/drain region is 150–200 nm.

13. The DRAM cell configuration according to claim 11, wherein said source/drain region has a width substantially corresponding to twice to three times a value of a width of said respective buried strap contact.

* * * * *